(12) United States Patent
Brooks et al.

(10) Patent No.: US 8,321,169 B2
(45) Date of Patent: *Nov. 27, 2012

(54) METHOD AND SYSTEM FOR COMPENSATING TEMPERATURE READINGS FROM A TEMPERATURE SENSING CRYSTAL INTEGRATED CIRCUIT

(75) Inventors: Todd Brooks, Laguna Beach, CA (US); Vinay Chandrasekhar, Irvine, CA (US); Josephus Van Engelen, Aliso Viejo, CA (US); Jared Welz, Seal Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/085,407

(22) Filed: Apr. 12, 2011

(65) Prior Publication Data

US 2011/0184686 A1 Jul. 28, 2011

Related U.S. Application Data

(63) Continuation of application No. 12/364,117, filed on Feb. 2, 2009, now Pat. No. 7,925,463.

(51) Int. Cl.
*G01K 15/00* (2006.01)
*G06F 19/00* (2011.01)
(52) U.S. Cl. ............ 702/99; 331/158; 368/202; 375/133
(58) Field of Classification Search .............. 702/64, 702/99, 104, 130; 327/513; 331/158, 176; 342/357.15; 368/202; 374/117; 375/133
See application file for complete search history.

(56) References Cited

U.S. PATENT DOCUMENTS

| 5,594,453 | A | 1/1997 | Rodal et al. |
| 5,654,718 | A | 8/1997 | Beason |
| 6,160,458 | A | 12/2000 | Cole et al. |
| 7,371,005 | B1 | 5/2008 | Ahuja |
| 7,925,463 | B2 * | 4/2011 | Brooks et al. .................. 702/99 |
| 2001/0053176 | A1 * | 12/2001 | Fry et al. ...................... 375/133 |

OTHER PUBLICATIONS

Rakon Limited, New Zealand Provisional Specification entitled Frequency Reference Device and/or a Method of Providing a Temperature Compensated Frequency, Application Patent No. 264490, dated Sep. 20, 1994, pp. 1-23.
Schodowski, Blair, An External Compensated Crystal Oscillator Study, Northern Illinois University article, 1986, pp. 169-178.

* cited by examiner

*Primary Examiner* — John H Le
(74) *Attorney, Agent, or Firm* — Thomas | Horstemeyer, LLP

(57) ABSTRACT

Aspects of a method and system for compensating temperature readings from a temperature sensing crystal integrated circuit are provided. An electronic device may digitize a temperature indication received from a temperature sensing circuit, digitize one or more calibration voltages received from said temperature sensing circuit, and calculate a compensated temperature indication utilizing the digitized calibration voltage(s), and the digitized temperature indication, and data from a table that characterizes behavior of the temperature sensing circuit as a function of temperature. One or more circuits in the electronic device may be controlled based on the compensated temperature indication. The compensated temperature indication may compensate for a gain error and/or offset error of a digital to analog converter that digitizes the temperature indication and the calibration voltage(s). There may be two calibration voltages.

21 Claims, 7 Drawing Sheets

FIG. 3

METHOD AND SYSTEM FOR COMPENSATING TEMPERATURE READINGS FROM A TEMPERATURE SENSING CRYSTAL INTEGRATED CIRCUIT

CROSS-REFERENCE TO RELATED APPLICATIONS/INCORPORATION BY REFERENCE

This patent application is a continuation of U.S. patent application Ser. No. 12/364,117 filed on Feb. 2, 2009.

This patent application also makes reference to:
U.S. patent application Ser. No. 12/364,046 filed on Feb. 2, 2009;
U.S. patent application Ser. No. 12/364,064 filed on Feb. 2, 2009; and
U.S. patent application Ser. No. 12/364,095 filed on Feb. 2, 2009.

Each of the above stated applications is hereby incorporated herein by reference in its entirety.

FIELD OF THE INVENTION

Certain embodiments of the invention relate to signal processing. More specifically, certain embodiments of the invention relate to a method and system for compensating temperature readings from a temperature sensing crystal integrated circuit.

BACKGROUND OF THE INVENTION

A crystal oscillator is an electronic circuit that uses mechanical resonance of a vibrating crystal of piezoelectric material to create an electrical signal with a relatively precise frequency. This frequency is commonly used as a reference or clock signal for a variety of circuits. The vibration of the crystal may vary with temperature and/or over time. Such variations in the resonant frequency of the crystal may create instabilities or other lead to other problems in an electronic system.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for compensating temperature readings from a temperature sensing crystal integrated circuit, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 3 illustrates exemplary data tables stored in a TSCIC, in accordance with an embodiment of the invention.

DETAILED DESCRIPTION OF THE INVENTION

Certain embodiments of the invention may be found in a method and system for compensating temperature readings from a temperature sensing crystal integrated circuit. In various embodiments of the invention, a temperature indication and one or more calibration voltages from a temperature sensing crystal integrated circuit (TSCIC) may be digitized and the resulting digital signals may be utilized to calculate a compensated temperature indication. Data derived from a memory integrated within the TSCIC may be retrieved based on the compensated temperature indication. The retrieved data may be utilized to control operation of one or more circuits. The compensated temperature indication may be calculated by removing a gain error and/or offset error from the digitized temperature indication. The compensated temperature indication may be utilized as a data table index. The compensated temperature indication may be a normalized compensated temperature indication. The calibration voltages may comprise a minimum voltage and/or a maximum voltage that a temperature sensing module of the TSCIC is operable to output. The minimum voltage may correspond to a minimum temperature the TSCIC is operable to measure and the maximum voltage may correspond to a maximum temperature the TSCIC is operable to measure.

The compensated temperature indication may be calculated utilizing multiple iterations, where a preliminary compensated temperature indication may be calculated utilizing ideal values for the one or more calibration voltages, actual values of the one or more calibration voltages may be retrieved from the memory utilizing the preliminary compensated temperature indication, and the actual values of the one or more calibration voltages may be utilized to calculate the compensated temperature indication. The temperature indication and/or the one or more calibration voltages may be digitized via a delta-sigma analog-to-digital converter. The one or more calibration voltages and the temperature indication may be output by the TSCIC in response to a command received via a communication bus. The data may characterize behavior of the TSCIC over temperature and/or time.

Figure 1:
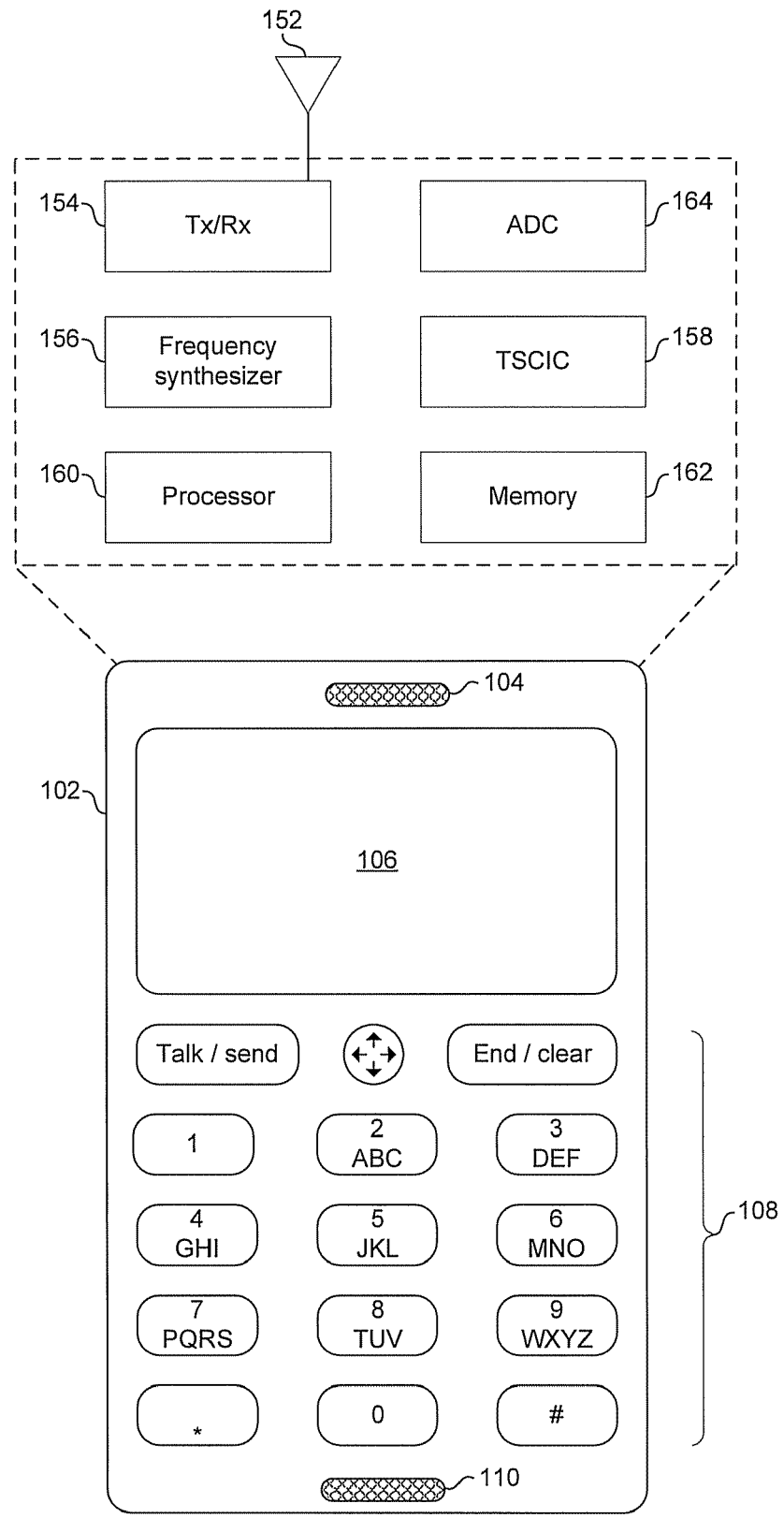
FIG. 1 is a block diagram illustrating an exemplary communication device comprising a temperature sensing crystal integrated circuit (TSCIC), in accordance with an embodiment of the invention.

FIG. 1 illustrates an exemplary communication device comprising a TSCIC, in accordance with an embodiment of the invention. Although a communication device is used for illustration, a TSCIC may be utilized in any type of electronic device. In one exemplary embodiment of the invention, the TSCIC may be utilized in a GPS system to enable fast(er) acquisition of GPS signals. The communication device 102 may comprise an antenna 152, a transmitter and/or receiver module (Tx/Rx) 154, a processor 160, a memory 162, an analog to digital converter (ADC) 164, a TSCIC 158, a display 106, user controls 108, a speaker 104, and a microphone 110.

The antenna 152 may be suitable for transmitting and/or receiving wireless signals. Although a single antenna is illustrated, the invention is not so limited. In this regard, the Tx/Rx 154 may utilize a common antenna for transmission and reception, may utilize different antennas for transmission and reception, and/or may utilize a plurality of antennas for transmission and/or reception.

The TSCIC 158 may comprise a crystal and suitable logic, circuitry, and/or code that may be operable to generate one or more oscillating signals. Additionally, the TSCIC 158 may provide one or more signals and data that may enable determination of a frequency of the generated oscillating signals over time and/or temperature variations. Block diagrams of exemplary TSCICs are described below with respect to FIGS. 2A and 2B. In some embodiments of the invention, the TSCIC 158 may be coupled to one or more external components to realize a crystal oscillator circuit. In other embodiments of the invention, the TSCIC 158 may comprise one or more active and/or passive components coupled to a crystal to realize a crystal oscillator circuit. In such embodiments, the TSCIC 158 may generate an oscillating signal without external components. In various embodiments of the invention, the TSCIC 158 may be configurable to output a temperature indication or a calibration value via one of its terminals. The temperature indication and/or the calibration value may be voltages or currents.

The frequency synthesizer 156 may comprise suitable logic, circuitry, and/or code that may be operable to generate one or more oscillating signals. In some embodiments of the invention, the frequency synthesizer 156 may comprise active and/or passive components which may be coupled to xtal+ and xtal− terminals of the TSCIC 158 to realize a crystal oscillator circuit. In some embodiments of the invention, the frequency synthesizer may comprise, for example, an integer-N PLL, fractional-N PLL, and/or a direct digital frequency synthesizer (DDFS). An output of the crystal oscillator circuit be coupled to and provide a reference frequency to the PLL and/or DDFS.

In the exemplary embodiment of the invention depicted in FIG. 1, the frequency synthesizer 156 is shown as a separate block, however, the invention is not so limited. In various embodiments of the invention a portion, or all, of the frequency synthesizer 156 may be integrated into the TSCIC 158 and/or a portion, or all, of the frequency synthesizer 156 may be integrated into the Tx/Rx 154.

The Tx/Rx 154 may comprise suitable logic, circuitry, interfaces, and/or code that may be operable to transmit and/or receive signals utilizing a variety of wireless protocols. Exemplary communication wireless protocols utilized by the communication device 102 may comprise various cellular protocols, WiMAX, Bluetooth, Wi-Fi, DVB-H/S/T, GNSS, broadcast radio, and broadcast television. The Tx/Rx 154 may be operable to perform amplification, down-conversion, filtering, demodulation, and analog to digital conversion of received signals. The Tx/Rx 154 may be operable to perform amplification, up-conversion, filtering, modulation, and digital to analog conversion of signals to be transmitted. In various embodiments of the invention, the Tx/Rx 154 may utilize one or more reference frequencies from the frequency synthesizer 156 and/or the TSCIC 158.

The processor 160 may comprise suitable logic, circuitry, interfaces, and/or code that may enable processing data and/or controlling operations of the communication device 102. The processor 160 may be enabled to provide and receive control signals to and from the various other portions of the communication device 102. The processor 160 may control transfers of data between various portions of the communication device 102. In this regard, the processor 160 may control reads and writes to memories and/or control registers in the communication device 102. Additionally, the processor 160 may enable execution of applications programs and/or code. The applications, programs, and/or code may enable, for example, processing of data, configuring portions of the communication device 102, and/or controlling operation of the communication device 102. In this regard, the processor 160 may comprise a plurality of registers and an arithmetic and logic unit (ALU) for performing mathematical and logical manipulations of data and/or control signals. For example, the processor 160 may be operable to perform algebraic computations to compensate for gain error and/or an offset error introduced, by the ADC 164 during digitization of voltages output by the TSCIC.

The memory 162 may comprise suitable logic, circuitry, and/or code that may enable storage or programming of information comprising parameters and/or code that may effectuate the operation of the communication device 102. Stored information may comprise, for example, code to be executed by the processor 160, received data, and/or data to be presented, transmitted, and/or otherwise processed. In an exemplary embodiment of the invention, the memory 162 may store instructions which may be executed by the processor 160 to compensate for gain and offset errors from digitized voltages output by the ADC 164. Furthermore, the memory 162 may store the digitized signals generated by the ADC 164 and/or the results of the instructions executed and/or calculations performed by the processor 160. Additionally, in various embodiments of the invention, the memory 162 may store data characterizing behavior of the TSCIC 158.

The ADC 164 may comprise suitable logic, circuitry, interfaces, and/or code that may enable conversion of analog signals to a digital representation. In this regard, the ADC 164 may, for example, sample and quantize an analog signal at times specified by a sample clock. In various embodiments of the invention, the ADC 164 may generate digital signals of one or more serial or parallel bits. Non-idealities of the ADC 164 may result in a gain and offset error in the digital signals output by the ADC 164. When digitizing a temperature indication from the TSCIC 158, such gain and/or offset errors may result in prohibitively large frequency errors that may negate the benefits of temperature compensation. Accordingly, various aspects of the invention may be operable to provide compensation for such gain and offset errors.

The display 106 may comprise suitable logic, circuitry, interfaces and/or code that may be operable to provide visual information to, and/or enable interaction by, a user of the communication device 102. In various embodiments of the invention, a graphical user interface may be presented via the display 106. The user interface of the mobile communication device 102 may be utilized to select which source or sources it may have a desire to receive content from. A frequency and/or wireless standard to be utilized for communication may be selected based on user input. Accordingly, based on such user input, the frequency synthesizer 156 and/or the Tx/Rx 154 may be adjusted and/or configured. In various embodiments of the invention, a visual media content such as video, images, and text may be presented via the display 106.

The user controls 108 may be operable to enable user interaction with the communication device 102 to control services and/or content handled by the communication device 102. The user controls 108 may comprise, for example, a keypad, a keyboard, a roller ball, a multidirectional button, a scroll wheels, and/or a touch screen.

The speaker 104 may be operable to present audio information to a user. The speaker may present voice from a phone call and/or music or ringtones played back by the communication device.

The microphone 110 may be operable to convert acoustic signals into electronic signals. The microphone may enable a user to participate in a phone call and/or interact with the communication device via oral input.

In operation, the TSCIC 158 may output an analog indication of a temperature of the TSCIC 158. The ADC 164 may digitize the temperature indication and provide the digitized temperature indication to the processor 160. The processor 160 may generate a compensated temperature indication. In this regard, the compensated temperature indication may be utilized to retrieve data from a data table characterizing the behavior of the TSCIC 158 over temperature. In one exemplary embodiment of the invention, the data table may be generated and stored in the TSCIC 158 during production of the TSCIC 158 and the indices of the data table may be generated based on the temperature indication as output by the TSCIC 158. Consequently, gain and/or offset errors introduced in the digitized temperature indication by the ADC 164 may prevent accurate and/or optimal determination of a frequency and/or frequency correction value for the indicated temperature. Accordingly, the processor 160 may perform one or more calculations or otherwise process the digitized temperature indication to compensate for the gain and/or offset errors introduced by the ADC 164. The processor 160 may then look up the compensated temperature indication, or an index based on the compensated temperature indication, in the data table.

In an exemplary embodiment of, the invention, the communication device 102 may be operable to determine location information based on received global navigation satellite system (e.g., GPS, GLONASS, or GALILEO) signals. The TSCIC 158 may generate a temperature indication and the processor 160 may adjust a frequency output by the frequency synthesizer 156 to the Tx/Rx 154, where the frequency may be utilized for receiving GNSS signals. Additionally, the processor 160 may estimate the uncertainty or error in the adjusted frequency of the PLL. In this regard, the accuracy of the estimate may determine an effort or time required for the Tx/Rx 154 to lock onto the GPS signals and determine the location of the device 102. In various embodiments of the invention, the frequency accuracy may be estimated based on or more of the following factors: time since the last frequency adjustment, the rate of change of temperature of the TSCIC 158 (or a crystal therein), time since start up of a crystal oscillator, past frequency estimates corresponding to the current temperature indication, past frequency estimates corresponding to other temperature indications, past temperature indications, and hysteresis of a crystal oscillator.

Figure 2A:
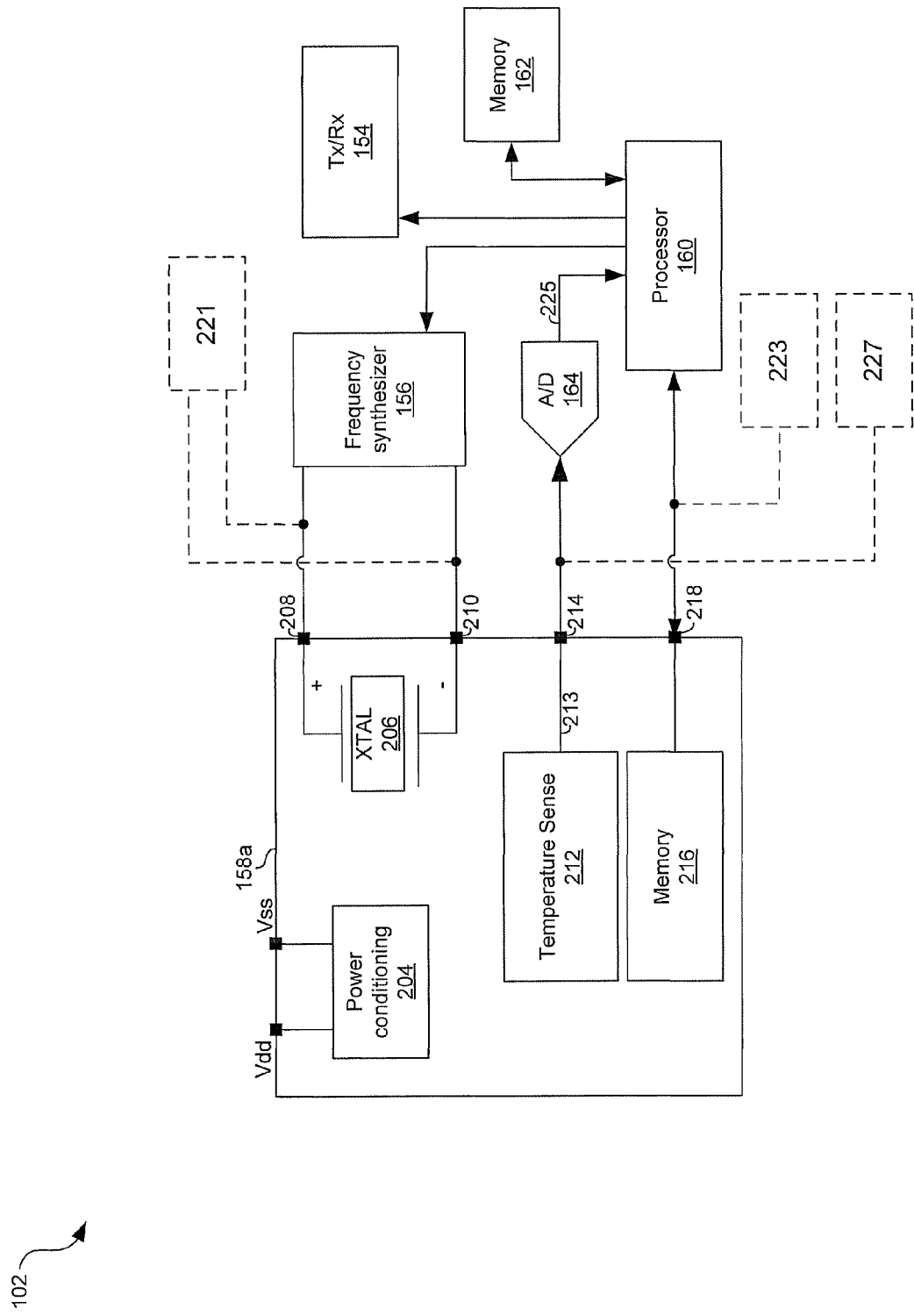
FIG. 2A is a block diagram illustrating an exemplary TSCIC, in accordance with an embodiment of the invention.

FIG. 2A is a block diagram illustrating an exemplary TSCIC, in accordance with an embodiment of the invention. Referring to FIG. 2A, there is shown TSCIC 158a and exemplary coupling between the various devices of the communication device 102. The TSCIC 158a may be an exemplary embodiment of the TSCIC 158 of FIG. 1. In an exemplary embodiment of the invention, the frequency synthesizer 156, the processor 160, the memory 162, and the ADC 164 may be integrated into a system on chip (SoC). The TSCIC 158a comprises a crystal 206, a temperature sensing module 212, and a memory 216. Additionally, in some embodiments of the invention, the TSCIC 158a may comprise a power conditioning block 204.

The frequency synthesizer 156, the processor 160, the memory 162, and the Tx/Rx 154 may be as described with respect to FIG. 1.

The ADC 164 may comprise suitable logic, circuitry, interfaces, and/or code that may be operable to digitize the signal 213 and generate the signal 225. Accordingly, the digital signal 225 may convey a digitized temperature indication or a digitized calibration voltage, depending on a configuration and/or state of the temperature sensing module 212.

The power conditioning block 204 may comprise suitable logic, circuitry, interfaces, and/or code that may be operable to generate one or more regulated voltages and/or currents from a supply voltage Vdd–Vss. In various embodiments of the invention, the power conditioning block 204 may be operable to implement a power-on-reset to ensure the TSCIC 158a powers up and/or initializes properly. In an exemplary embodiment of the invention, the voltage Vdd may be +1.8V and Vss may be 0V or GND. The power conditioning block 204 may be operable to reduce, increase, limit, filter, or otherwise condition the supply voltage to generate power rails for powering the temperature sensing module 212 and the memory 216. Notwithstanding, in various embodiments of the invention the TSCIC 158a may function reliably and/or sufficiently from an external power supply and may not comprise a power conditioning block 204.

The crystal 206 may comprise a piece of a piezoelectric material. A resonant frequency of the crystal 206 may be utilized to provide a reference frequency for an electronic circuit. The resonant frequency of the crystal 206 may depend on the material, the size, and the shape of the material, and may also depend on the temperature of the crystal. Accordingly, aspects of the invention may enable compensating for the temperature dependence of the resonant frequency of the crystal 206. Devices external to the TSCIC 158a may be coupled to the crystal 206 via the terminals 208 and 210. In this regard, one or more devices such as other processors or frequency synthesizers, represented generically as device 221, may be coupled to the terminals 208 and 210 instead of, or in addition to, the frequency synthesizer 156.

The memory 216 may comprise suitable logic, circuitry, interfaces, and/or code operable to store data. In various embodiments of the invention, the memory 204 may be non-volatile memory such as flash or fuse based memory or an EEPROM. In various embodiments of the invention, the memory 216 may be read only or may be writable. In this regard, one or more flags in the memory 216 may indicate whether the memory 216 is writable and/or whether contents of the memory 216 have been modified. In this manner, data, which may be compressed utilizing known or proprietary algorithms, may be stored in the memory 216 during production of the TSCIC 158a and may be remain valid during and subsequent to installation of the TSCIC 158a into a device such as the communication device 102 of FIG. 1. Data and/or control signals may be communicated between the memory 216 and the processor 160 via the terminal 218. Additionally, one or more devices such as other processors and/or controllers, represented generically as device 223, may be coupled to the terminal 218 instead of, or in addition to, the processor 160. The memory 216 may be operable to store one or more data tables, such as the data tables described below with respect to FIG. 3, which may characterize the behavior of the TSCIC 158a over temperature. In this regard, the data tables may be indexed based on temperature indications measured and/or recorded at the terminal 214. Gain and/or offset errors introduced by the ADC 164 may cause a digitized temperature indication, output as signal 225, to differ from the temperature indication at terminal 214. Consequently, utilizing the digitized temperature indication as a table index, or to generate a table index, may result in sub-optimal frequency and/or frequency correction values being retrieved from the memory 216. Accordingly, various aspects of the invention may be operable to provide compensation for the gain and/or offset error introduced by the ADC 164.

The temperature sensing module 212 may comprise suitable logic, circuitry, interfaces, and/or code that may be operable to generate a signal 213, which may be indicative of a temperature of the crystal 206 or a calibration voltage. Temperature indications and calibration voltages may be communicated to devices external to the TSCIC 158a via the terminal 214. Additionally, one or more devices, such as other processors and/or analog-to-digital converters, represented generically as device 227, may be coupled to the terminal 214 instead of, or in addition to, the ADC 164. Whether signal 213 corresponds to a temperature or calibration voltage may depend, for example, on one or more control signals or a state of the temperature sensing module. In an exemplary embodiment of the invention, the signal 213 may be a voltage that ranges from 0V to 1V over a temperature range of −30° C. to +75° C., with 0V and/or 1V being output as calibration voltages. Notwithstanding, the invention is not so limited and other voltage ranges and/or temperature ranges may be utilized without departing from the various embodiments of the invention.

In operation, the temperature sensing module 212 may be operable to generate a calibration voltage, which is represented as signal 213. The ADC 164 may digitize the calibration voltage and output the digital calibration voltage as signal 225. The processor 160 may receive the digitized calibration voltage and may, for example, store it in a first register. The temperature sensing module 212 may then output a temperature indication as signal 213. The ADC 164 may digitize the temperature indication and output the digital temperature indication as signal 225. The processor 160 may receive the digitized temperature indication and may, for example, store it in a second register. The processor 160 may then utilize the digitized calibration voltage and the digitized temperature indication to calculate a compensated temperature indication that is independent of the gain and offset errors of the ADC 164. The processor 160 may retrieve data from the memory 162 and/or the memory 216 utilizing the calculated compensated temperature indication, or a table index generated based on the compensated temperature indication.

Figure 2B:
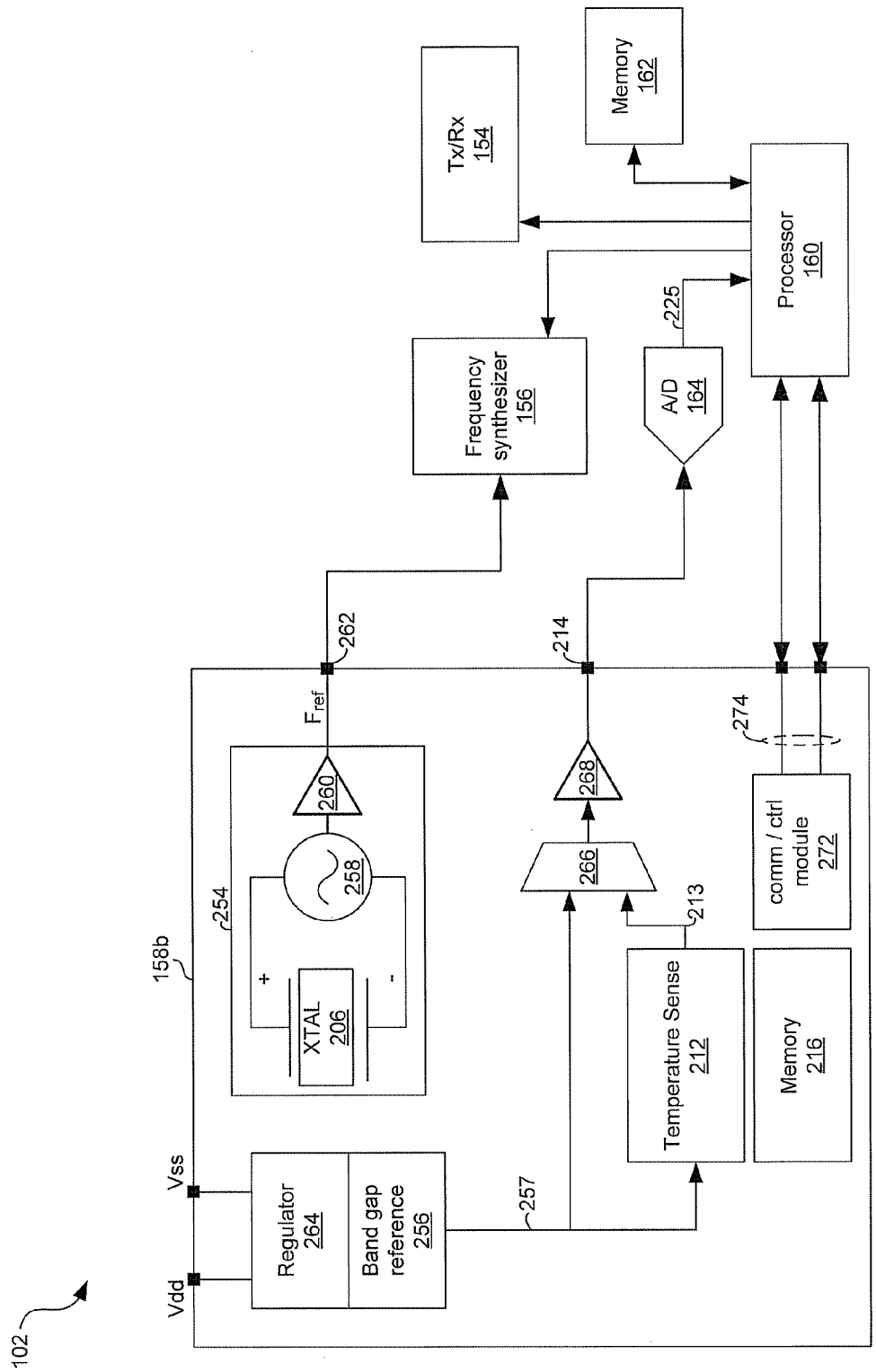
FIG. 2B is a block diagram illustrating another exemplary TSCIC, in accordance with an embodiment of the invention.

FIG. 2B is a block diagram illustrating another exemplary TSCIC, in accordance with an embodiment of the invention. Referring to FIG. 2B, there is shown TSCIC 158b and exemplary coupling between the various devices of the communication device 102. The TSCIC 158b may be an exemplary embodiment of the TSCIC 158 of FIG. 1. The TSCIC 158b comprises a band gap reference module 256, a regulator 264, a crystal oscillator 254, a switching element 266, a buffer 268, a temperature sensing module 212, a memory 216, and a communication and control module 272.

The communication and control module 272 may comprise suitable logic, circuitry, interfaces, and/or code operable to communicate with external devices via the communication bus 274 and to control and/or configure the various components of the TSCIC 158b. The communication and control module 272 may comprise one or more registers for configuring the TSCIC 158b and/or indicating attributes of the TSCIC 158b. The communication and control module 272 may be operable to receive one or more signals from the various other devices of the TSCIC 158b. The communication and control module 272 may be operable to receive signals via the communication bus 274. The communication and control module 272 may be operable to generate one or more signals to control or configure other components of the TSCIC 158b. In this regard, control signals generated may be in response to signals received from the other components of the TSCIC 158b and/or via the communication bus 274.

The communication and control module 272 may be operable to communicate signals to other devices via the communication bus 274. In this regard, control signals generated may be in response to signals received from the other components of the TSCIC 158b and/or via the bus 274. For example, the communication and control module 272 may be operable to write and/or read to and/or from the memory 216 based on commands received via the communication bus 274. In this regard, the communication and control module 272 may write data received via the bus 274 to the memory 216 and may communicate data read from the memory 216 over the communication bus 274.

The frequency synthesizer 156, the processor 160, the memory 162, the ADC 164, and the Tx/Rx 154 may be as described with respect to FIG. 1 and FIG. 2A. The temperature sensing module 212 and the memory 216 may be substantially as described with respect to FIG. 2A.

The band gap reference module 256 may be operable to output a reference voltage that may be approximately equal to the theoretical band gap of the material of which the TSCIC 158b is fabricated. For example, for silicon the band gap reference voltage 257 may be approximately 1.25V. The band gap reference voltage 257 may be provided to the temperature sensing module 212 such that the signal 213 generated by the temperature sensing module 212 may be highly accurate and stable over a range of temperatures and over time. In one exemplary embodiment of the invention, the band gap reference module 256 may be a sub-module of the power conditioning module 204 described with respect to FIG. 2A.

The regulator 264 may comprise suitable logic, circuitry, interfaces, and/or code that may be operable to regulate one or more voltages and/or currents supplied to the crystal oscillator 254, the temperature sensing module 212, the memory 216, the switching element 266, the buffer 268, and/or the communication and control module 272. In this regard, the regulator 264 be a linear or switching regulator and may filter, boost, buck, enable and disable, or otherwise condition the power in the TSCIC 158b. In one exemplary embodiment of the invention, the regulator 264 may be a sub-module of the power conditioning module 204 described with respect to FIG. 2A.

The crystal oscillator 254 may comprise an oscillator circuit 258 coupled to the crystal 206 and buffered by the buffer 260. The crystal 206 may be coupled as a load of the oscillator circuit 258 which may comprise one or more active and/or passive components.

The switching element 266 may comprise suitable logic, circuitry, interfaces, and/or code operable to route either the band gap reference 257 or the signal 213 to the buffer 268 for conveyance to the ADC 164 via the terminal 214. The switching element 266 may be controlled via one or more signals from the communication and control module 272. In an exemplary embodiment of the invention, the switching element 266 may comprise a multiplexer.

In operation, the communication and control module 272 may receive a command from processor 160 via the communication bus 274 to output a calibration voltage via the terminal 214. In some embodiments of the invention, the temperature sensing module 212 may be configured to output a calibration voltage as signal 213 and the switching element 266 may be configured to route the signal 213 to the terminal 214. In other embodiments of the invention, the switching element 266 may be configured to output the band gap reference 257 as the calibration voltage. The ADC 164 may digitize the signal 213 and output the digital calibration voltage as signal 225. The processor 160 may receive the digital calibration voltage and store it in a register. The processor 160 may then send a command to the TSCIC 158b to output a temperature indication. Accordingly, the communication and control module 272 may configure the temperature sensing module 212 to output a temperature indication as signal 213. The ADC 164 may digitize the signal 213 and output the digital temperature indication as signal 225. The processor 160 may be operable to receive the digital temperature indication and may utilize the digital calibration voltage and the digital temperature indication to calculate a compensated temperature indication that is independent of gain error and/or offset error introduced by the ADC 164. The processor 160 may then retrieve data from the memory 162 and/or the memory 216 utilizing the calculated compensated temperature indication, or a table index generated based on the compensated temperature indication.

Figure 3:
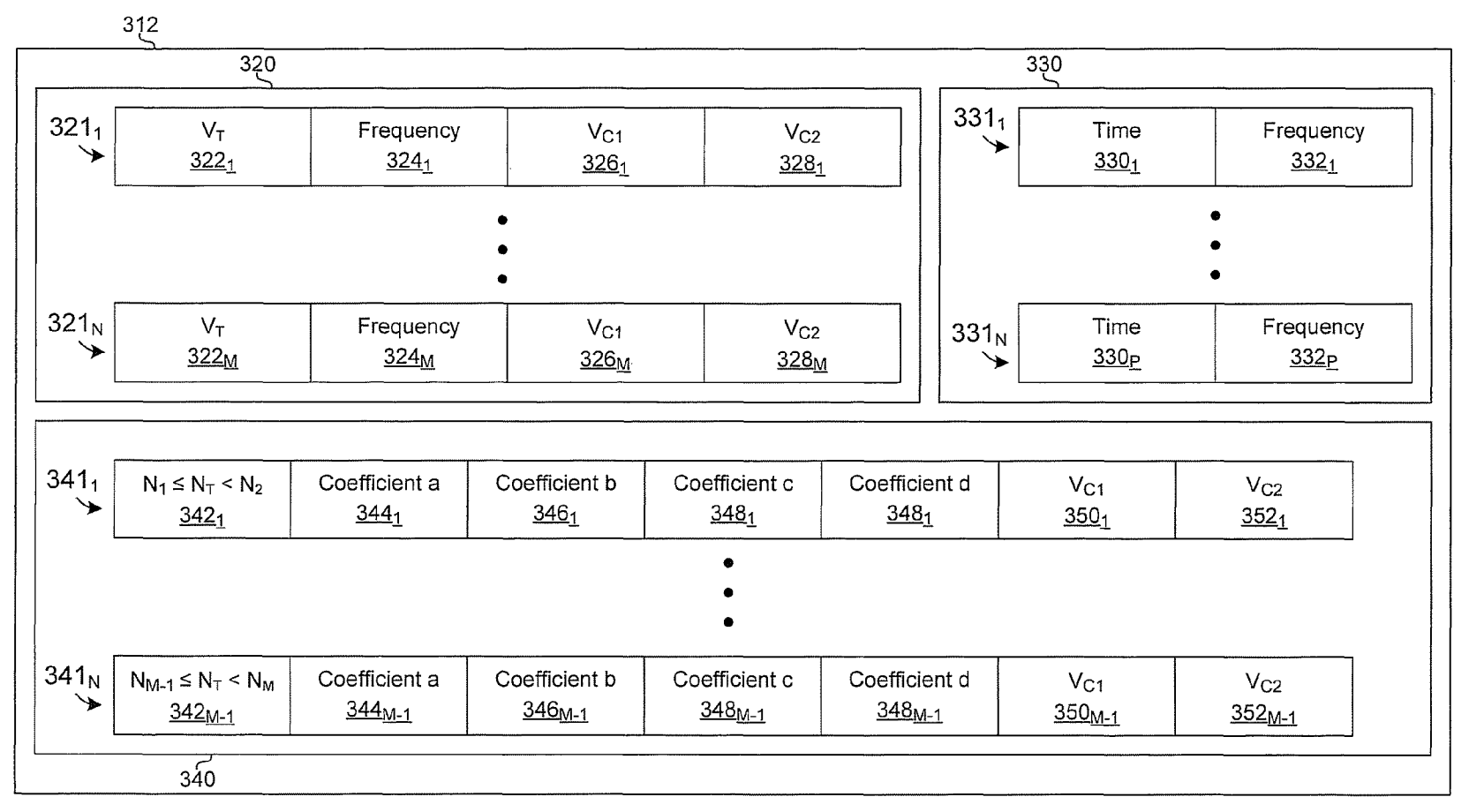

FIG. 3 illustrates exemplary data tables stored in a TSCIC, in accordance with an embodiment of the invention. Referring to FIG. 3 there are shown exemplary data tables 320, 330, and 340. In various embodiments of the invention, one or more of the data tables may be stored in the memory 216. In various embodiments of the invention, the data tables, or one or more fields of the data tables 320, 330, and 340 may be compressed.

The data table 320 may comprise entries $321_1, \ldots, 321_M$ corresponding to M data points of a temperature indication vs. frequency curve characterizing the TSCIC 158, where M is an integer. The data table 320 may be indexed by M measured temperature indications stored in fields $322_1, \ldots, 322_M$. The fields $324_1, \ldots, 324_M$ may comprise M measured frequencies, or measured frequency correction values, corresponding, respectively, to the M measured temperature indications. The fields $326_1, \ldots, 326_M$ may comprise M measured values of a $1^{st}$ calibration voltage corresponding, respectively, to the M measured temperature indications. The fields $328_1, \ldots, 328_M$ may comprise M measured values of a $2^{nd}$ calibration voltage corresponding, respectively, to the M measured temperature indications.

In operation, in an exemplary embodiment of the invention, the processor 160 may calculate, utilizing a digitized temperature indication and a digitized calibration voltage, compensated temperature indication $V_x$, wherein the calculation may compensate for gain and/or offset errors introduced during digitization. The processor 160 may then search the fields $322_1, \ldots, 322_M$ for the value $V_x$. In some instances $V_x$ may be found in a field $322_m$, where m is between 1 and M. Accordingly, the processor 160 may read the fields $324_m$, $326_m$ and $328_m$ to configure the Tx/Rx 154 and/or the frequency synthesizer 156. In some embodiments of the invention, in instances that a match for $V_x$ is not found in the fields $322_1, \ldots, 322_M$, the processor 160 may round $V_x$ up or down to the closest entry $322_m$. In other embodiments of the invention, in instances that a match for $V_x$ is not found in the fields $322_1, \ldots, 322_M$, the processor 160 may round up and down to determine the two nearest entries $322_m$ and $322_{m+1}$. The processor 160 may then interpolate between the value of entry $324_m$ and the value of entry $324_{m+1}$ to calculate a frequency and/or frequency correction value.

The data table 330 may comprise entries $331_1, \ldots, 331_P$ corresponding to P data points of a time vs. frequency curve of the TSCIC 158, where P is an integer. In an exemplary embodiment of the invention, the fields $332_1, \ldots, 332_P$, may each comprise a value corresponding to a time since start-up of the TSCIC 158. In another exemplary embodiment of the invention, the fields $334_1, \ldots, 334_P$, may each comprise a frequency or frequency adjustment value corresponding to a total time of operation of the crystal 206 or crystal oscillator 254.

In operation, the processor 160, utilizing the memory 162, may keep track of how long the crystal 206 or crystal oscillator 254 has been operating, either since its last start-up or over its lifetime. Accordingly, when the time of operation reaches or exceeds the value of entry $332_p$, the processor 160 may utilize the frequency or frequency adjustment value stored in entry $334_p$ to configure or adjust the communication device 102, where p is between 1 and P.

The data table 340 may comprise entries $341_1, \ldots, 341_M$ corresponding to M−1 pieces of a spline interpolation of M data points of a temperature vs. frequency curve characterizing the TSCIC 158, where M is an integer. The data table 340 may be indexed by the fields $342_1, \ldots, 342_M$ which may each comprise two measured normalized temperature indications serving as endpoints of a piece of the spline. In this regard, the normalized compensated temperature indications may be in the form described below in EQ. 10. The fields $344_1, \ldots, 344_{M-1}$; $346_1, \ldots, 346_{M-1}$; $348_1, \ldots, 348_{M-1}$; $350_1, \ldots, 350_{M-1}$ may comprise coefficients of M−1 polynomials approximating the M−1 pieces of the spline. The fields $352_1, \ldots, 352_{M-1}$ may comprise M−1 measured values of a $1^{st}$ calibration voltage corresponding, respectively, to the M−1 pieces of the spline. The fields $354_1, \ldots, 354_{M-1}$ may M−1 measured values of a $2^{nd}$ calibration voltage corresponding, respectively, to the M−1 pieces of the spline. In this regard, in an exemplary embodiment of the invention, the calibration voltages may be relatively constant and thus may be treated as constant over each piece of the spline.

In operation, in an exemplary embodiment of the invention, the processor 160 may calculate, utilizing a digitized temperature indication and a digitized calibration voltage, normalized temperature indication $N_x$, wherein the calculation may compensate for gain and/or offset errors introduced during digitization. The processor 160 may then search the fields $342_1, \ldots, 342_M$ for the range $N_w < N_x < N_y$. Upon finding the correct temperature range in the field $342_m$, the processor 160 may read the polynomial coefficients fields $344_m$ $346_m$, $348_m$, and $350_m$ and calculate a frequency or frequency correction value utilizing the polynomial. In an exemplary embodiment of the invention, the spline interpolation may be a cubic spline interpolation and thus each entry 341 may comprise four coefficients. However, the invention is not limited in the interpolation method used, and other types of interpolation may be utilized without departing from the spirit and/or scope of the various embodiments of the invention.

Figure 4A:
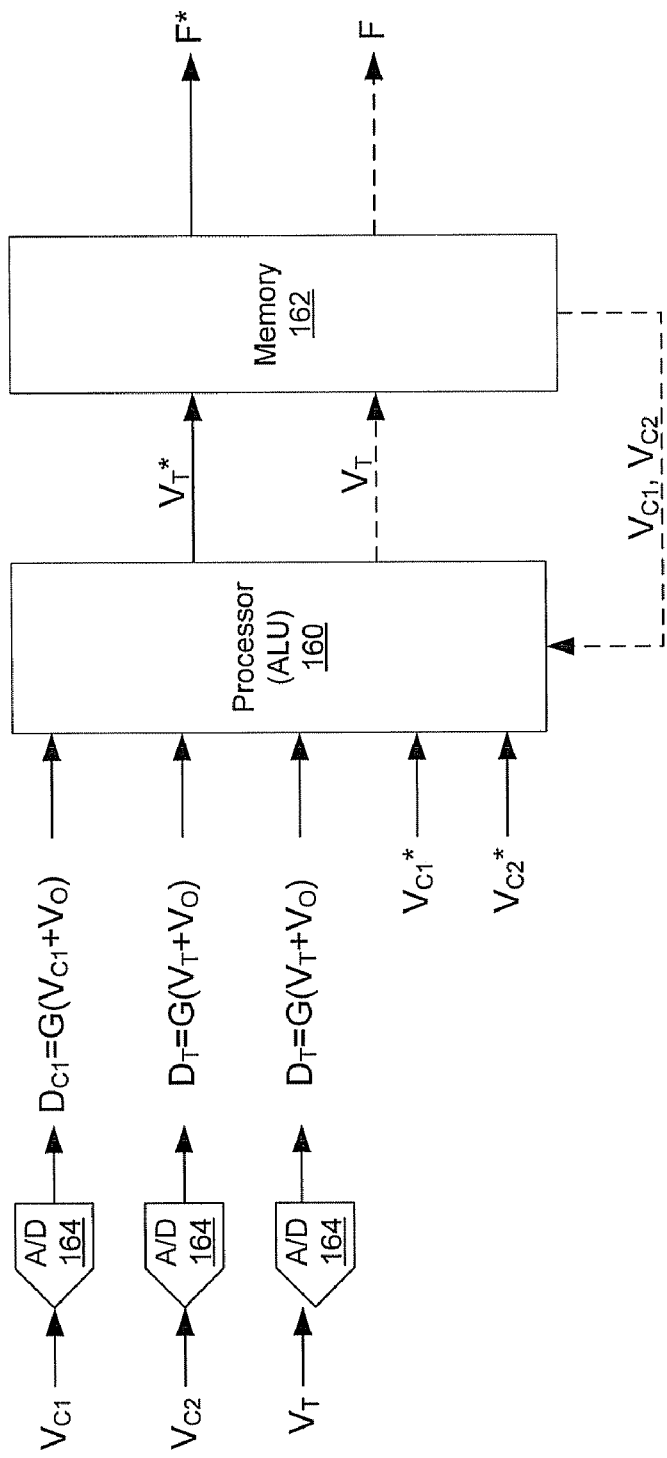
FIG. 4A is a diagram illustrating exemplary calculation of a compensated temperature indication, in accordance with an embodiment of the invention.

FIG. 4A is a diagram illustrating exemplary calculation of a compensated temperature indication, in accordance with an embodiment of the invention. Referring to FIG. 4A there is shown the A/D 164, the processor 160, and the memory 162, each of which may be as described with respect to FIGS. 2A and 2B. Although the ADC 164 is shown multiple times, various embodiments of the invention may comprise a single ADC 164 and digitization of $V_{C1}$, $V_{C2}$, and $V_T$ may occur successively with the digitized values being stored in a memory such as the memory 162.

In operation, the TSCIC 158 may output a calibration voltage $V_{O1}$, a calibration voltage $V_{C2}$, and a temperature indication, $V_T$. The calibration voltage $V_{C1}$ may be, for example, a minimum voltage that the temperature sensing module 212 is operable to generate. The calibration voltage $V_{C2}$ may be, for example, a maximum voltage that the temperature sensing module 212 is operable to generate. The ADC 164 may digitize $V_{C1}$ to generate $D_{C1}$, $V_{C2}$ to generate $D_{C2}$, and $V_T$ to generate $D_T$. The ADC 164 may introduce a gain error, G, and an offset error, $V_O$, and thus the digitized values may be given by EQ.1, EQ. 2, and EQ. 3.

$$D_{C1}=G(V_{C1}+V_O) \quad \text{EQ. 1}$$

$$D_{C2}=G(V_{C2}+V_O) \quad \text{EQ. 2}$$

$$D_T=G(V_T+V_O) \quad \text{EQ. 3}$$

Solving EQ. 1 for $V_O$ results in EQ. 4.

$$V_O = \frac{1}{G}D_{C1} - V_{C1} \quad \text{EQ. 4}$$

Solving EQ. 1 for G results in EQ. 5.

$$G = \frac{D_{C1}}{V_{C1} + V_O} \quad \text{EQ. 5}$$

Inserting EQ. 4 into EQ. 2, assuming $V_{C1}$ to be an ideal value $V_{C1}^*$ and $V_{C2}$ to be an ideal value $V_{C2}^*$, may enable solving for G as shown in EQ. 6.

$$G = \frac{D_{C2} - D_{C1}}{V_{C2}^* - V_{C1}^*} \quad \text{EQ. 6}$$

Inserting EQ. 5 into EQ. 2, assuming $V_{C1}$ to be an ideal value $V_{C1}^*$ and $V_{C2}$ to be an ideal value $V_{C2}^*$, may enable solving for $V_O$ as shown in EQ. 7.

$$V_O = \frac{D_{C1}V_{C2}^* - D_{C2}V_{C1}^*}{D_{C2} - D_{C1}} \quad \text{EQ. 7}$$

Inserting EQ. 5 and EQ. 6 into EQ. 3 may enable solving for $V_T^*$ independent of the gain error G and the offset error $V_O$, as shown in EQ. 8.

$$D_T = \frac{D_{C2}D_{C1}}{V_{C2}^* - V_{C1}^*}\left(V_T^* + \frac{D_{C1}V_{C2}^* - D_{C2}V_{C1}^*}{D_{C2} - D_{C1}}\right) \quad \text{EQ. 8}$$

where $V_T^*$ is a preliminary value of the compensated temperature indication $V_T$ output by the temperature sensing module 212. The accuracy of the approximation may depend on the deviation of the actual calibration voltages $V_{C1}$ and $V_{C2}$ from the ideal calibration voltages $V_{C1}^*$ and $V_{C2}^*$.

In some embodiments of the invention, subsequent to calculating $V_T^*$, data characterizing operation of the TSCIC 158 may be retrieved from a data table in the memory 216. For example, an entry 321, with an index of $V_T^*$ may be retrieved from the data table 320 described with respect to FIG. 3.

In some embodiments of the invention, two or more iterations, as indicated by the dashed lines in FIG. 4A, may be performed to calculate a compensated temperature indication, or a data table index based on the compensated temperature indication. In this regard, $V_T^*$ may be utilized to retrieve actual values, $V_{C1}$ and $V_{C2}$, of the calibration voltages from the memory 216. $V_{C1}$ and $V_{C2}$ may, in turn, be utilized to calculate $V_T$. Accordingly, an entry, such as an entry 321, with an index of $V_T$ may be retrieved from a data table, such as the table 320.

Figure 4B:
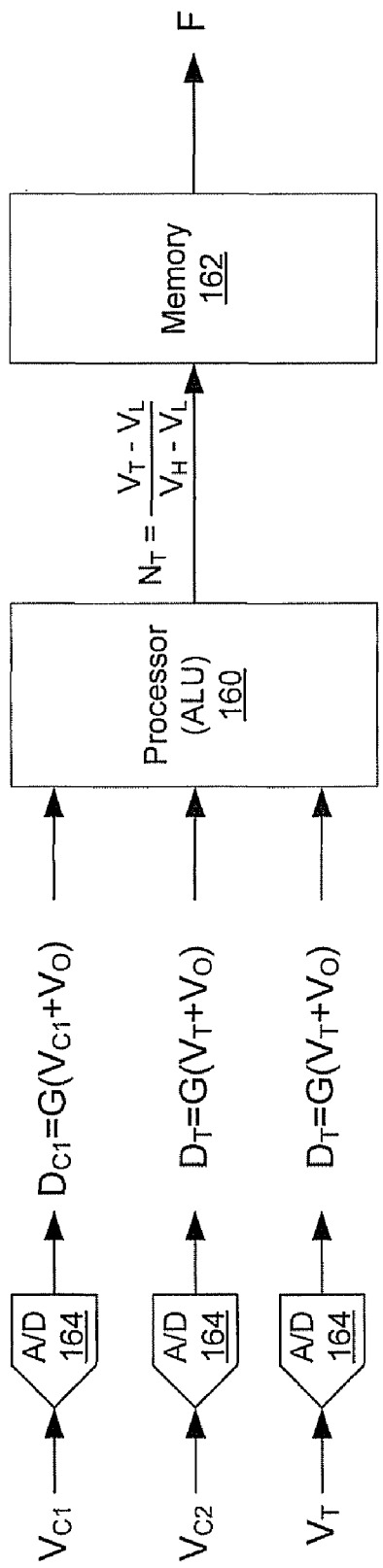
FIG. 4B is a diagram illustrating exemplary calculation of a normalized compensated temperature indication, in accordance with an embodiment of the invention.

FIG. 4B is a diagram illustrating exemplary calculation of a normalized compensated temperature indication, in accordance with an embodiment of the invention. Referring to FIG. 4B there is shown the ADC 164, the processor 160, and the memory 162, each of which may be as described with respect to FIGS. 2A and 2B. Although the ADC 164 is shown multiple times, various embodiments of the invention may comprise a single ADC 164 and digitization of $V_{C1}$, $V_{C2}$, and $V_T$ may occur successively with the digitized values being, for example, stored in a registers of the processor 160 or in the memory 162.

In operation, the TSCIC 158 may output a calibration voltage $V_{C1}$, a calibration voltage $V_{C2}$, and a temperature indication $V_T$. The calibration voltage $V_{C1}$ may be, for example, a minimum voltage that the temperature sensing module 212 is operable to generate. The calibration voltage $V_{C2}$ may be, for example, a maximum voltage that the temperature sensing module 212 is operable to generate. The ADC 164 may digitize $V_{C1}$ to generate $D_{C1}$, digitize $V_{C2}$ to generate $D_{C2}$, and digitize $V_T$ to generate $D_T$. The ADC 164 may introduce a gain error, G, and an offset error, $V_O$, and thus the digitized values may be given by EQ.9, EQ. 10, and EQ. 11.

$$D_{C1}=G(V_{C1}+V_O) \quad \text{EQ. 9}$$

$$D_{C2}=G(V_{C2}-V_O) \quad \text{EQ. 10}$$

$$D_T=G(V_T+V_O) \quad \text{EQ. 11}$$

Subtracting the $D_{C1}$ from $D_T$ may generate a difference $\Delta_1$ that does not depend on $V_O$, as shown in EQ. 12. Subtracting the $D_{C1}$ from $D_{C2}$ may generate a difference $\Delta_2$ that does not depend in $V_O$, as shown in EQ. 13.

$$\Delta_1=G(V_T+V_O)-G(V_{C1}+V_O)=G(V_T+V_{C1}) \quad \text{EQ. 12}$$

$$\Delta_2=G(V_{C2}+V_O)-G(V_{C1}+V_O)=G(V_{C2}+V_{C1}) \quad \text{EQ. 13}$$

Dividing EQ. 12 by EQ. 13 results in a normalized compensated temperature indication $N_T$ independent of G and V, as shown in EQ. 14.

$$N_T = \frac{\Delta_1}{\Delta_2} = \frac{G(V_T + V_{C1})}{G(V_{C2} + V_{C1})} = \frac{V_T + V_{C1}}{V_{C2} + V_{C1}} \quad \text{EQ. 14}$$

Subsequent to calculating $N_T$, data characterizing operation of the TSCIC 158 may be retrieved from a data table in the memory 216. For example, an entry 341 (FIG. 3A), with an index of $N_T$ may be retrieved from the data table 340.

Figure 5:
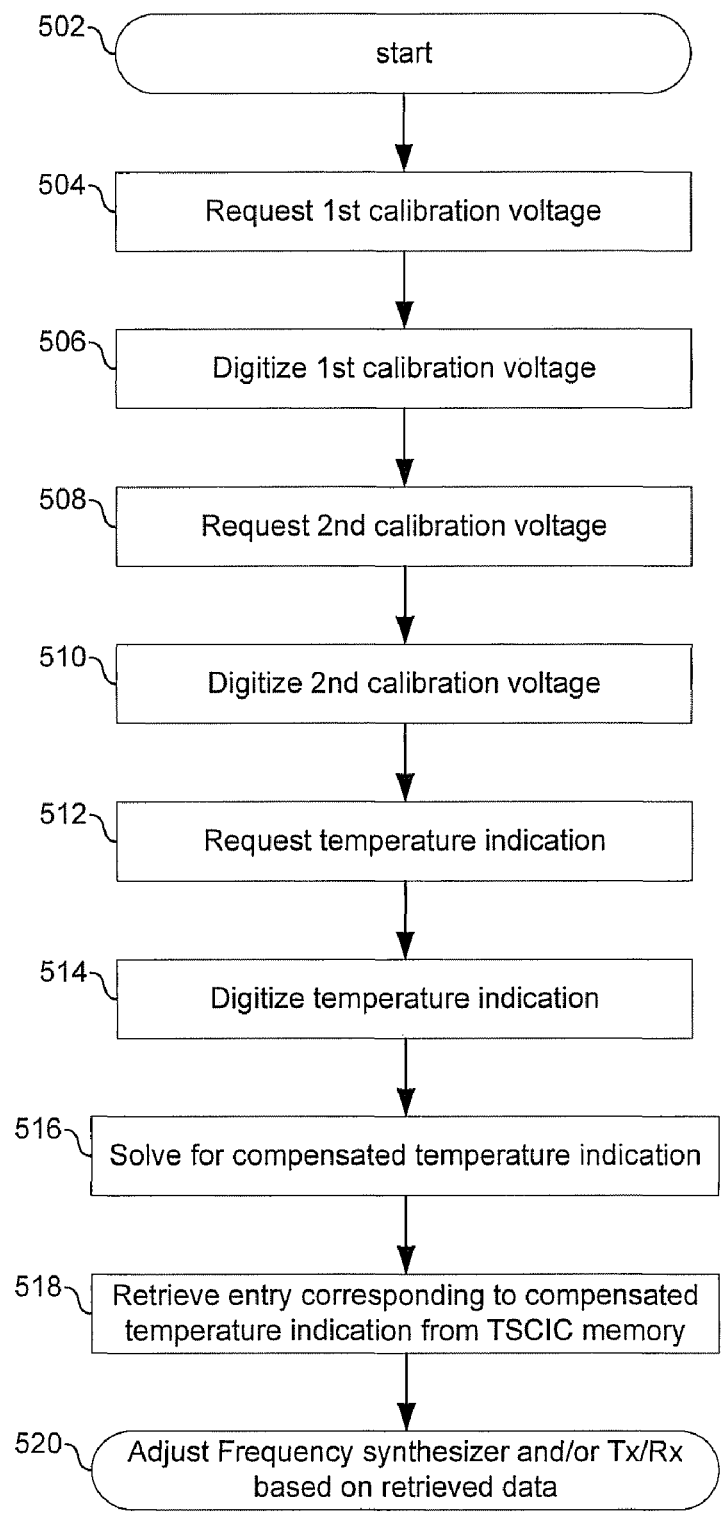
FIG. 5 is a flow chart illustrating exemplary steps for retrieving TSCIC characterization data by calculating a compensated temperature indication, in accordance with an embodiment of the invention.

FIG. 5 is a flow chart illustrating exemplary steps for retrieving TSCIC characterization data by calculating a compensated temperature indication, in accordance with an embodiment of the invention. Referring to FIG. 5, subsequent to start step 502, the exemplary steps may advance to step 504.

In step 504, a first calibration voltage may be requested from a TSCIC. For example, the processor 160 may transmit a request over the communication bus 274 to the communication and control module 272. The communication and control module 212 may respond by configuring the switching element 266 and the temperature sensing module 212 to output a first calibration voltage via the terminal 214. Subsequent to step 504, the exemplary steps may advance to step 506.

In step 506, the first calibration may be digitized for conveyance to a processor or controller. For example, the ADC

164 may convey a digital representation of the first calibration voltage to the processor 160. The processor 160 may store the first calibration voltage to one of its registers and/or write the value to the memory 162. Subsequent to step 506, the exemplary step may advance to step 508.

In step 508, a second calibration voltage may be requested from the TSCIC. For example, the processor 160 may transmit a request over the communication bus 274 to the communication and control module 272. The communication and control module 272 may respond by configuring the switching element 266 and the temperature sensing module 212 to output a second calibration voltage via the terminal 214. Subsequent to step 508, the exemplary steps may advance to step 510.

In step 510, the second calibration voltage may be digitized for conveyance to a processor or controller. For example, the ADC 164 may convey a digital representation of the second calibration voltage to the processor 160. The processor 160 may store the second calibration voltage to one of its registers and/or write the value to the memory 162. Subsequent to step 510, the exemplary step may advance to step 512.

In step 512, a temperature indication may be requested from the TSCIC. For example, the processor 160 may transmit a request over the communication bus 274 to the communication and control module 272. The communication and control module 272 may respond by configuring the switching element 266 and the temperature sensing module 212 to output a temperature indication via the terminal 214. Subsequent to step 512, the exemplary steps may advance to step 514.

In step 514, the temperature indication may be digitized for conveyance to a processor or controller. For example, the ADC 164 may convey a digital representation of the temperature indication to the processor 160. The processor 160 may store the temperature indication to one of its registers and/or write the value to the memory 162. Subsequent to step 514, the exemplary step may advance to step 516.

In step 516, a compensated temperature indication may be calculated utilizing the calibration voltages and the temperature indication. For example, a compensated temperature indication or normalized temperature indication may be calculated substantially as described with respect to FIGS. 4A and 4B. Subsequent to step 516, the exemplary steps may advance to step 518.

In step 518, the compensated temperature indication may be utilized to retrieve data from a memory. In this regard, the compensated temperature indication may itself be utilized as a data table index, or a data table index may be calculated based on the compensated temperature indication. Subsequent to step 518, the exemplary steps may advance to step 520.

In step 520, on or more portions of an electronic system may be configured and/or adjusted based on the data retrieved in step 518. For example, the Tx/Rx 154 and/or the frequency synthesizer 156 of the communication system 102 may be reconfigured.

Various aspects of a method and system for compensating temperature readings from a temperature sensing crystal integrated circuit are provided. In an exemplary embodiment of the invention, a temperature indication and one or more calibration voltages from a temperature sensing crystal integrated circuit (TSCIC) 158 may be digitized and the digital signals 225 may be utilized to calculate a compensated temperature indication. Data derived from a memory 216 integrated within the TSCIC 158 may be retrieved based on the compensated temperature indication. The retrieved data may be utilized to control operation of one or more circuits, such as the TX/Rx 154 and the frequency synthesizer 156. The compensated temperature indication may be calculated by removing a gain error and/or offset error from the digitized temperature indication. The compensated temperature indication may be utilized as an index for a data table, such as the data tables 320 and 340. The compensated temperature indication may be a normalized compensated temperature indication, an exemplary form of which may be shown in EQ. 14. The calibration voltages may comprise a minimum voltage and/or a maximum voltage that a temperature sensing module 212 of the TSCIC is operable to output. The minimum voltage may correspond to a minimum temperature the TSCIC 158 is operable to measure and the maximum voltage may correspond to a maximum temperature the TSCIC 158 is operable to measure.

The compensated temperature indication may be calculated utilizing multiple iterations, wherein a preliminary compensated temperature indication may be calculated utilizing ideal values for the one or more calibration voltages, actual values of the one or more calibration voltages may be retrieved from the memory utilizing the preliminary compensated temperature indication, and the actual values of the one or more calibration voltages may be utilized to calculate the compensated temperature indication. An analog to digital converter 164 may digitize the temperature indication and/or the one or more calibration voltages and may be a delta-sigma converter. The one or more calibration voltages and the temperature indication may be output by the TSCIC 158 in response to a command received via a communication bus. The data may characterize behavior of the TSCIC 158 over temperature and/or time.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for compensating temperature readings from a temperature sensing crystal integrated circuit.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method comprising:
in an electronic device:
digitizing a temperature indication received from a temperature sensing circuit;
digitizing one or more calibration voltages received from said temperature sensing circuit;
calculating a compensated temperature indication utilizing said digitized one or more calibration voltages, said digitized temperature indication, and data from a table that characterizes behavior of said temperature sensing circuit as a function of temperature; and
controlling operation of one or more circuits in said electronic device based on said compensated temperature indication.

2. The method according to claim 1, wherein said compensated temperature indication compensates for a gain error, an offset error, or both a gain error and an offset error of a digital to analog converter that performs said digitization of said temperature indication and said digitization of said one or more calibration voltages.

3. The method according to claim 1, wherein said compensated temperature indication is a normalized compensated temperature indication.

4. The method according to claim 1, wherein said one or more calibration voltages comprise two calibration voltages.

5. The method according to claim 4, wherein:
a first one of said two calibration voltages corresponds to a maximum temperature that said temperature sensing circuit is operable to measure; and
a second one of said two calibration voltages corresponds to a minimum temperature that said temperature sensing circuit is operable to measure.

6. The method according to claim 1, comprising calculating said compensated temperature indication utilizing multiple iterations, wherein:
a preliminary compensated temperature indication is calculated utilizing ideal values for said one or more calibration voltages;
actual values of said one or more calibration voltages are determined utilizing said preliminary compensated temperature indication; and
said actual values of said one or more calibration voltages are utilized to calculate said compensated temperature indication.

7. The method according to claim 1, wherein:
said electronic device comprises a delta-sigma analog-to-digital converter; and
said delta-sigma analog-to-digital converter performs said digitizing of said temperature indication.

8. The method according to claim 7, wherein said delta-sigma analog-to-digital converter performs said digitizing of said one or more calibration voltages.

9. The method according to claim 1, wherein said one or more calibration voltages and said temperature indication are output by said temperature sensing circuit in response to a command received via a communication bus.

10. The method according to claim 9, wherein said one or more calibration voltages and said temperature indication are received from said temperature sensing circuit via said communication bus.

11. A system comprising:
one or more circuits in an electronic device, said one or more circuits being operable to:
digitize a temperature indication received from a temperature sensing circuit;
digitize one or more calibration voltages received from said temperature sensing circuit;
calculate a compensated temperature indication utilizing said digitized one or more calibration voltages, said digitized temperature indication, and data from a table that characterizes behavior of said temperature sensing circuit as a function of temperature; and
control operation of one or more circuits in said electronic device based on said compensated temperature indication.

12. The system according to claim 11, wherein said compensated temperature indication compensates for a gain error, an offset error, or both a gain error and an offset error of a digital to analog converter that performs said digitization of said temperature indication and said digitization of said one or more calibration voltages.

13. The system according to claim 11, wherein said compensated temperature indication is a normalized compensated temperature indication.

14. The system according to claim 11, wherein said one or more calibration voltages comprise two calibration voltages.

15. The system according to claim 14, wherein:
a first one of said two calibration voltages corresponds to a maximum temperature that said temperature sensing circuit is operable to measure; and
a second one of said two calibration voltages corresponds to a minimum temperature that said temperature sensing circuit is operable to measure.

16. The system according to claim 11 wherein said one or more circuits are operable to calculate said compensated temperature indication utilizing multiple iterations, wherein:
a preliminary compensated temperature indication is calculated utilizing ideal values for said one or more calibration voltages;
actual values of said one or more calibration voltages are determined utilizing said preliminary compensated temperature indication; and
said actual values of said one or more calibration voltages are utilized to calculate said compensated temperature indication.

17. The system according to claim 11, wherein:
said electronic device comprises a delta-sigma analog-to-digital converter; and
said delta-sigma analog-to-digital converter performs said digitizing of said temperature indication.

18. The system according to claim 17, wherein said delta-sigma analog-to-digital converter performs said digitizing of said one or more calibration voltages.

19. The system according to claim 11, wherein said one or more calibration voltages and said temperature indication are output by said temperature sensing circuit in response to a command received via a communication bus.

20. The system according to claim 19, wherein said one or more calibration voltages and said temperature indication are received from said temperature sensing circuit via said communication bus.

21. A system comprising:
means for digitizing a temperature indication received from a temperature sensing circuit;
means for digitizing one or more calibration voltages received from said temperature sensing circuit;

means for calculating a compensated temperature indication utilizing said digitized one or more calibration voltages, said digitized temperature indication, and data from a table that characterizes behavior of said temperature sensing circuit as a function of temperature; and means for controlling operation of one or more circuits in said electronic device based on said compensated temperature indication.

\* \* \* \* \*